(12) United States Patent
Lee et al.

(10) Patent No.: US 6,362,963 B1
(45) Date of Patent: Mar. 26, 2002

(54) HEAT SINK CLIP

(75) Inventors: Dongyun Lee, ShenZhen (CN); Hsieh Kun Lee, Chung-Ho (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/686,450

(22) Filed: Oct. 10, 2000

(30) Foreign Application Priority Data

Jun. 17, 2000 (TW) ........................................ 089210373

(51) Int. Cl.$^7$ ................................................ H05K 7/20
(52) U.S. Cl. ........................ 361/704; 361/690; 361/694; 165/80.3; 257/718; 257/719; 257/722; 257/727; 411/516; 24/458
(58) Field of Search ................................ 361/687, 703, 361/704, 709, 710, 717–719; 267/150, 158, 160; 24/295, 297, 453, 458, 497, 625; 257/718, 719, 727; 174/16.3; 165/80.3, 185

(56) References Cited

U.S. PATENT DOCUMENTS

| | | | | |
|---|---|---|---|---|
| 5,371,652 A | * | 12/1994 | Clemens et al. | 361/704 |
| 5,396,402 A | * | 3/1995 | Perugini et al. | 361/704 |
| 5,600,540 A | * | 2/1997 | Blomquist | 361/704 |
| 5,933,325 A | * | 8/1999 | Hou | 361/704 |
| 6,205,026 B1 | * | 3/2001 | Wong et al. | 361/704 |
| 6,226,186 B1 | * | 5/2001 | Chien | 361/704 |

* cited by examiner

*Primary Examiner*—Leo P. Picard
*Assistant Examiner*—Boris L. Chervinsky
(74) *Attorney, Agent, or Firm*—Wei Te Chung

(57) ABSTRACT

A heat sink clip (4) includes a fastener (42) and a handle (44). The fastener includes a body (46) and first and second arms (54, 56) extending downward from opposite ends of the body. The first and second arms each define an aperture (58) for engaging with a corresponding tab (2) formed on an electronic device retention module (10). A pressing portion (64) is stamped adjacent a horizontal portion (48) of the body. The pressing portion is engagingly received in a slot (26) defined in a heat sink (20), and presses the heat sink against an electronic device (80) positioned in a socket connector adjacent the retention module. The handle has an operation section (72) and a joint section (74) extending downward from the operation section. The joint section forms a pair of vertical hems (76) at respective opposite sides thereof which extend toward each other to define a space (78). The space interferentially receives protrusions (62) formed on the second arm, whereby the handle is attached to the fastener.

10 Claims, 3 Drawing Sheets

HEAT SINK CLIP

BACKGROUND

1. Field of the Invention

The present invention relates to a clip, and particularly to a clip for readily attaching a heat sink to an electronic device.

2. The Related Art

Many electronic devices such as Central Processing Units (CPUs) generate large amounts of heat during operation, which deteriorates their operational stability. To counter this problem, a heat sink is often mounted to a CPU for removing heat therefrom. Various clips have been used for attaching a heat sink to a CPU.

A conventional clip for attaching a heat sink to a CPU comprises a pressing body and two arms extending downwardly from opposite ends of the pressing body. Each arm defines an aperture for engaging with a tab formed on a socket on which the CPU is mounted. However, assembly and disassembly requires a tool, which makes these processes cumbersome and complicated. Furthermore, the pressing point of the clip which acts on the heat sink usually does not coincide with the center of the clip. Therefore, an eccentric moment can occur between the pressing point and the center of the clip. This may cause relative movement between the clip and the heat sink, thereby dislodging the heat sink.

Examples of the conventional clips are disclosed in Taivan Patent Applications Nos. 85211135, 85214941 and 86213035, and U.S. Pat. Nos. 5,602,719 and 5,600,54).

SUMMARY OF THE INVENTION

Accordingly, an object of the present invention is to provide a clip for readily attaching a heat sink to an electronic device, and for readily detaching the heat sink therefrom.

Another object of the present invention is to provide a clip for securely attaching a heat sink to an electronic device.

To achieve the above-mentioned objects, a heat sink clip comprises a fastener and a handle. The fastener comprises a body and first and second arms extending downward from respective opposite ends of the body. The first and second arms each define an aperture for engaging with a tab formed on an electronic device retention module. A pressing portion is stamped from a horizontal portion of the body, to be engagingly received in a slot defined in a heat sink. The pressing portion presses the heat sink against an electronic device positioned in the retention module. The handle has an operation section, and a joint section extending downward from the operation section. The joint section forms a pair of vertical hems at opposite sides thereof which extend toward each other, thereby defining a space. The space receives protrusions formed on the second arm, whereby the handle is attached to the fastener.

Other objects, advantages and novel features of the present invention will be drawn from the following detailed embodiment of the present invention with attached drawings, in which:

DESCRIPTION OF THE PREFERRED EMBODIMENT

Figure 1:
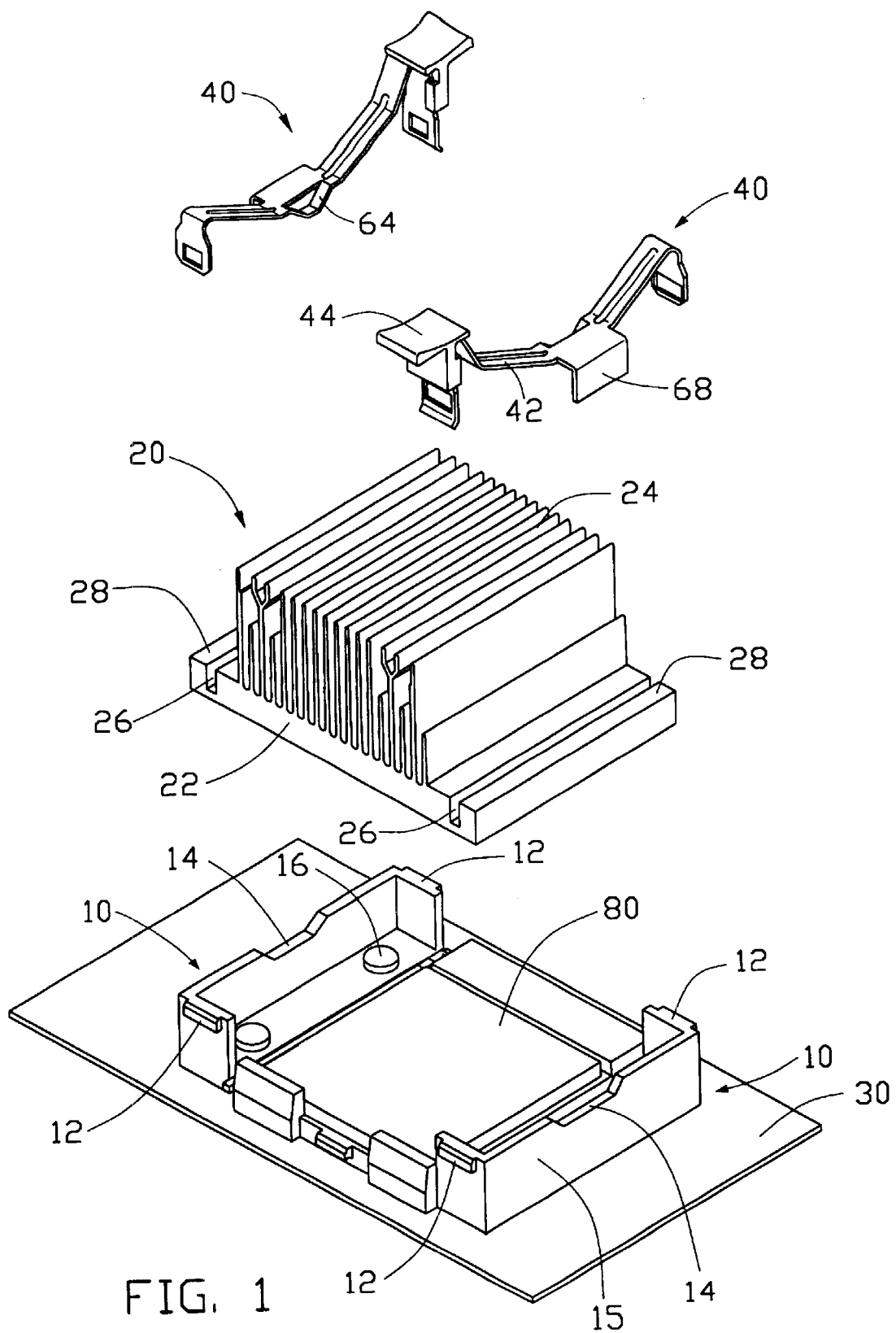
FIG. 1 is an exploded view showing two clips in accordance with the present invention used for attaching a heat sink to a CPU.

Referring to FIG. 1, a heat sink 20 includes a base 22. The base 22 defines a pair of parallel slots 26 at opposite sides of an upper surface thereof, a pair of shoulders 28 being formed adjacent to outer edges of each slot 26. A plurality of fins 24 extends vertically upward from the upper surface of the base 22 between the slots 26.

Each of a pair of U-shaped retention modules 10 forms a tab 12 at each of opposite sides thereof. Each retention module 10 defines a cutout 14 at the middle of a top edge of a sidewall 15 thereof. The retention modules 10 are mounted on a printed circuit board 30 by a plurality of pins 16 or other conventional means.

Figure 2:
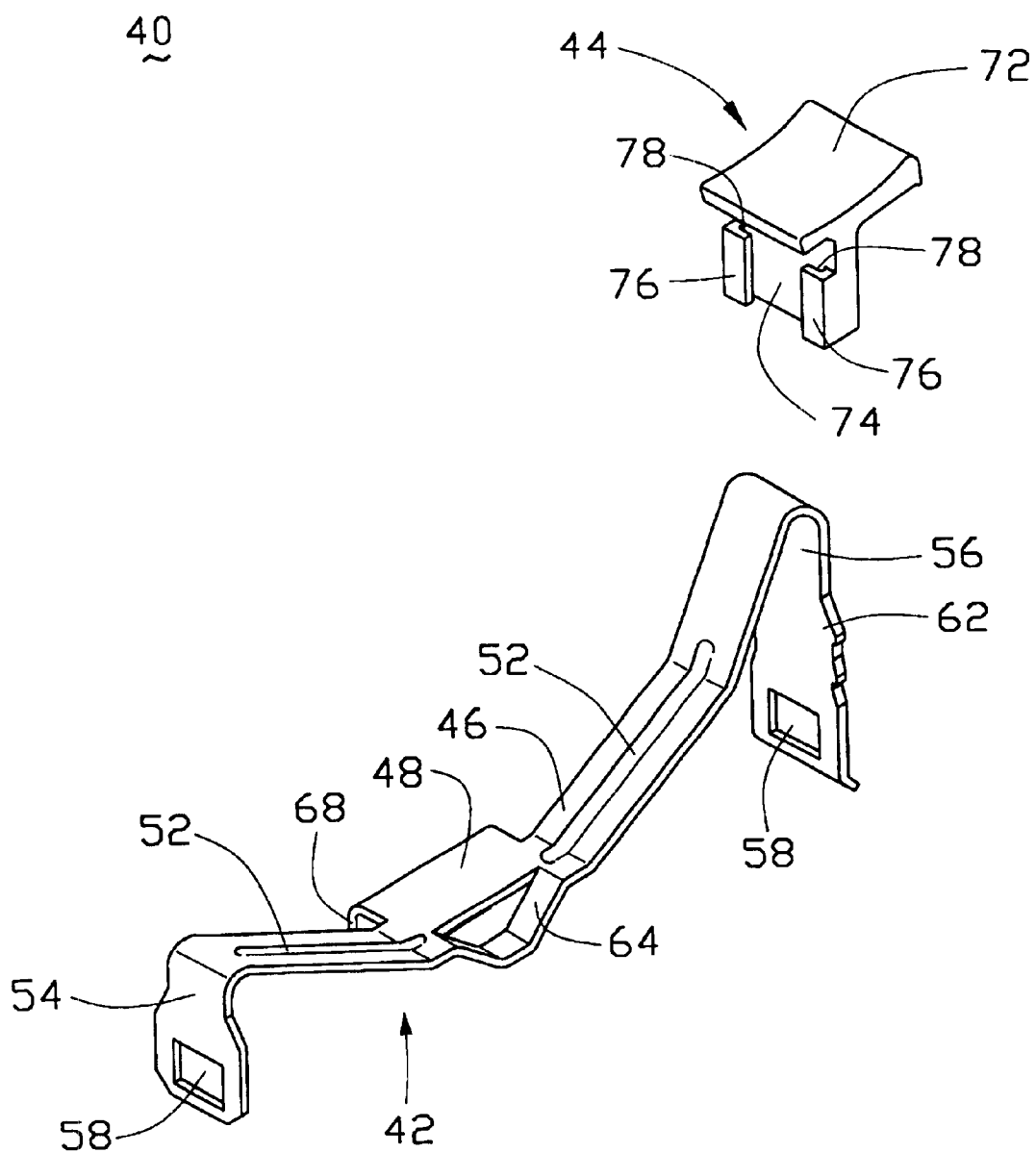
FIG. 2 is an exploded view of the clip of the present invention.

Also referring to FIG. 2, a clip 40 in accordance with the present invention comprises a fastener 42 and a handle 44. The fastener 42 includes a body 46 and first and second arms 54, 56 extending downward from opposite ends of the body 46. The body 46 forms a rib 52 to reinforce the clip 40. Protrusions 62 extend from opposite side edges of the second arm 56. Each arm 54, 56 defines an aperture 58. A horizontal portion 48 is formed at a middle portion of the body 46. A pressing portion 64 is stampedly formed in a middle portion of the body 46 adjacent the horizontal portion 48. The bottom of the pressing portion 64 is horizontal, for effectively pressing the heat sink 20 onto the retention modules 10. The pressing portion 64 has a width substantially equal to a width of the slot 26 of the heat sink 20. A flange 68 depends vertically from a side of the horizontal portion 48 opposite to the pressing portion 64.

The handle 44 of the clip 40 is generally T-shaped. The handle 44 has an operation section 72, and a joint section 74 depending downward from a bottom side of the operation section 72. The joint section 74 forms a pair of vertical hems 76 at opposite sides thereof. The hems 76 are L-shaped and extend toward each other. A receiving space 78 is respectively defined between each hem 76 and the joint section 74.

Figure 3:
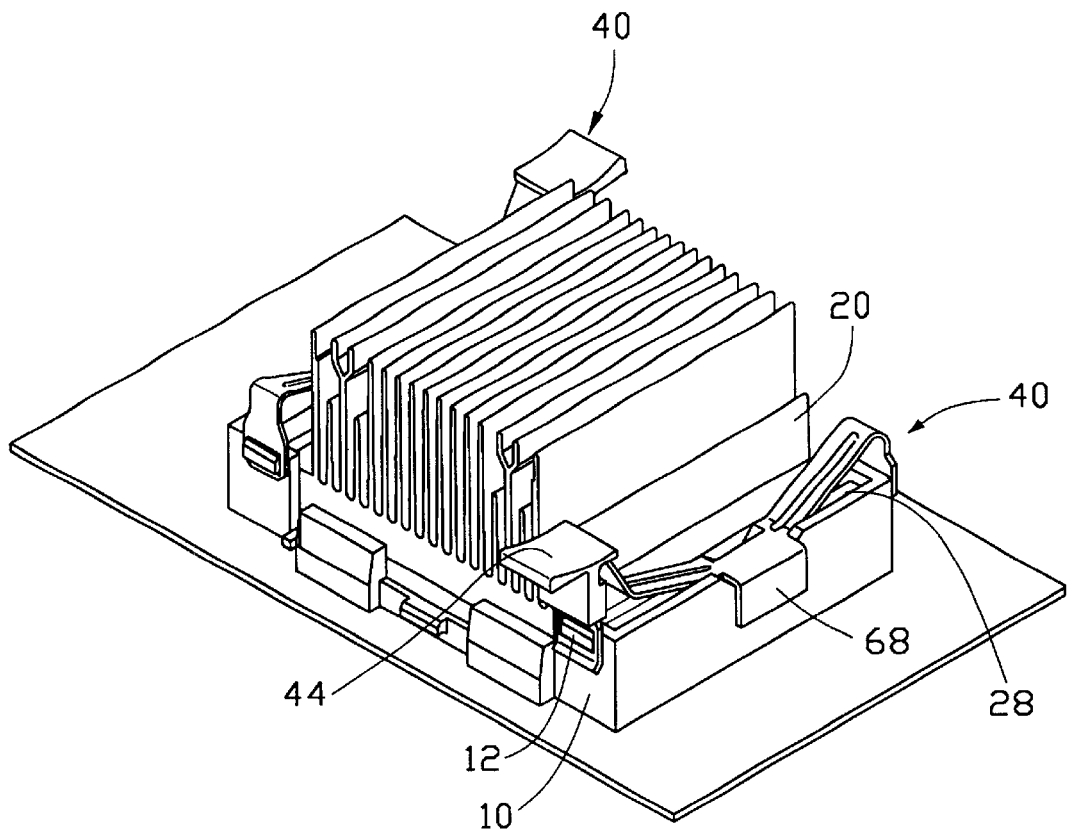
FIG. 3 is an assembled view of FIG. 1.

Also referring to FIG. 3, in assembly, an electronic device 80 such as a CPU (see FIG. 1) is inserted into a socket connector (not labeled) mounted on the printed circuit board 30. A pair of retention modules 10 is mounted on the printed circuit board 30 at both sides of the socket connector. The heat sink 20 is placed on the electronic device 80. The handle 44 of each clip 40 is then attached to the second arm 56 of the corresponding fastener 42. The protrusions 62 of the fastener 42 enter the receiving spaces 78 of the handle 44 and interferentially engage with inner surfaces of the hems 76 of the handle 44. The clips 40 are then attached to the corresponding retention modules 10. First, the aperture 58 of the first arm 54 of each clip 40 engages with the corresponding tab 12 of the retention module 10. The operation section 72 of the handle 44 is then depressed to cause the aperture 58 of the second arm 56 to engage with the other tab 12 of the retention module 10, thereby attaching the heat sink 20 to the electronic device 80. The horizontal portion 48 of each clip abuts a top surface of the corresponding shoulder 28 of the base 22 of the heat sink 20 and extends through the cutout 14 of the retention module 10. The pressing portion 64 of each clip 40 is engagingly and interferentially received in a corresponding slot 26 of the base 22 of the heat sink 20. An inner surface of the flange 68 of the clip 40 abuts against the corresponding sidewall 15 of the retention module 10, thereby preventing the heat sink 20 from moving in a lateral direction.

To release the clip 40, the operation section 72 of the handle 44 is depressed to detach the aperture 58 of the second arm 56 from the tab 12 of the retention module 10. This allows easy disengagement of the clip 40 from the heat sink 20.

It is understood that the invention may be embodied in other forms without departing from the spirit thereof. Thus, the present example and embodiment are to be considered in all respects illustrative and not restrictive, and the invention is not to be limited to the details given herein.

What is claimed is:

1. A heat sink clip comprising:

a body having at least a pressing portion being directly stamped from a horizontal portion of the body and engagingly received in a slot defined in a heat sink, the pressing portion generally forming a horizontal bottom to press a bottom of the slot thereby urging the heat sink against an electronic device; and first and second arms extending downward from opposite ends of the body, the arms adapted for engaging with an electronic device retention module.

2. The heat sink clip as described in claim 1, wherein the body forms at a flange opposite to the pressing portion, for abutting against a side wall of the retention module.

3. The heat sink clip as described in claim 1, further comprising a handle attached to the second arm.

4. The heat sink clip as described in claim 3, wherein a plurality of protrusions extend from opposite side edges of the second arm and wherein the handle has at least a joint section comprising at least a pair of hems formed at respective opposite sides thereof and extending toward each other, such that the hems interferentially receive the protrusions of the second arm.

5. An electronic device and heat sink assembly comprising:

a printed circuit board;

an electronic device mounted on the printed circuit board;

at least one retention module mounted at a side of the electronic device;

a heat sink positioned on the electronic device and having a base defining at least one slot; and at least one clip comprising a body having at least a pressing portion directly stamped from a portion of a horizontal portion of the at least one clip, engagingly received in the at least one slot of the heat sink and pressing a bottom of said slot thereby urging the heat sink against the electronic device, the body also having first and second arms extending downward from opposite ends of the body for engaging with the retention module.

6. The electronic device and heat sink assembly as described in claim 5, wherein the body of the clip forms at least a flange opposite to the pressing portion, for abutting against an outer surface of the retention module.

7. The electronic device and heat sink assembly as described in claim 5, wherein the clip further comprises a handle attached to the second arm of the clip.

8. The electronic device and heat sink assembly as described in claim 5, wherein the pressing portion of the clip has a width substantially equal to a width of the at least one slot of the heat sink.

9. A heat sink assembly comprising:

a printed circuit board;

an electronic device positioned on said printed circuit board;

a pair of retention modules positioned by two sides of the electronic device;

a heat sink positioned on the electronic device, said heat sink defining a groove in each of two opposite side portions;

a pair of clips each comprising a body having a horizontal portion abutting against a top face of the heat sink, a pressing portion directly stamped downwardly from an inner side portion of the horizontal portion and engageably received within the corresponding groove, except said pressing portion the rest of the inner side portion shielding said groove in a vertical direction, and a flange extending downwardly from an outer side of the horizontal portion opposite to the pressing portion and abutting against a side wall of the corresponding retention module, and a pair of arms extending downwardly from two opposite ends of the body of each of said pair of clips and latchably engaged with corresponding tabs on the retention module, respectively.

10. The assembly as described in claim 9, wherein the pressing portion is split and deformed from the horizontal portion.

* * * * *